United States Patent
Su et al.

(10) Patent No.: US 7,407,852 B2
(45) Date of Patent: Aug. 5, 2008

(54) TRENCH CAPACITOR OF A DRAM AND FABRICATING METHOD THEREOF

(75) Inventors: Yi-Nan Su, Taoyuan (TW); Jun-Chi Huang, Taichung County (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 11/161,760

(22) Filed: Aug. 16, 2005

(65) Prior Publication Data

US 2007/0040201 A1  Feb. 22, 2007

(51) Int. Cl.
*H01L 21/8242* (2006.01)
(52) U.S. Cl. .............. 438/243; 438/248; 257/E21.008; 257/E27.016; 257/E27.092
(58) Field of Classification Search ............... 257/301, 257/303, 305, E21.008, E27.016, E27.092; 438/243, 248
See application file for complete search history.

(56) References Cited

U.S. PATENT DOCUMENTS

| | | | | |
|---|---|---|---|---|
| 6,391,705 | B1 * | 5/2002 | Hsiao et al. ................ | 438/243 |
| 6,551,874 | B2 * | 4/2003 | Pohl et al. .................... | 438/243 |
| 6,552,382 | B1 * | 4/2003 | Wu ............................. | 257/305 |
| 7,041,567 | B2 * | 5/2006 | Chen et al. ................... | 438/386 |
| 2003/0132438 | A1 * | 7/2003 | Jang ............................ | 257/68 |
| 2004/0197988 | A1 * | 10/2004 | Heineck et al. ............. | 438/243 |
| 2005/0184326 | A1 * | 8/2005 | Cheng ........................ | 257/301 |
| 2006/0084224 | A1 * | 4/2006 | Watanabe et al. ........... | 438/243 |
| 2007/0015327 | A1 * | 1/2007 | Su ............................... | 438/244 |

* cited by examiner

*Primary Examiner*—Ngan Ngo
(74) *Attorney, Agent, or Firm*—Jianq Chyun IP Office

(57) ABSTRACT

A method of fabricating trench capacitors is described. A substrate having at least one isolation structure is provided. A first trench and a second trench are formed in the substrate beside the isolation structure. A first lower electrode and a second lower electrode are formed in the substrate around the first trench and the second trench. A first capacitor dielectric layer and a second capacitor dielectric layer are formed on the respective surfaces of the first trench and the second trench. A first upper electrode and a second upper electrode are formed to fill the first trench and the second trench. A portion of the isolation structure between the first trench and the second trench is removed to form an opening. A conductive layer is formed to fill the opening and connect electrically with the first upper electrode and the second upper electrode.

8 Claims, 13 Drawing Sheets

TRENCH CAPACITOR OF A DRAM AND FABRICATING METHOD THEREOF

BACKGROUND OF THE INVENTION

1. Field of the Invention

The present invention relates to a dynamic random access memory (DRAM). More particularly, the present invention relates to a trench capacitor of a DRAM and fabricating method thereof.

2. Description of the Related Art

As semiconductor finally enters the deep sub-micron regime, the dimensions of each device are significantly reduced. This means that the area for accommodating the capacitors of a DRAM is correspondingly reduced. On the other hand, with the ever-increasing size of computer application software, the amount of memory needed to operate the software also increases at an alarming rate. Such conflicting demand for a smaller dimension and a larger memory storage capacity implies that the former method of fabricating the capacitors of a DRAM must be modified to fit this trend.

According to the structure of capacitor, the DRAM can be classified into two major types, namely, the stack capacitor DRAM and the deep trench capacitor DRAM. With the constant pressure for reducing the dimension of semiconductor devices, an increasing number of technical problems are encountered in the fabrication of both types of DRAM.

In general, a DRAM device comprises a plurality of memory cells. Each memory cell includes an active device region and a deep trench capacitor (as shown in FIG. 1). FIG. 1 is a schematic cross-sectional view showing the structure of a conventional DRAM. The DRAM comprises a substrate 100, a capacitor 102, an isolation structure 104, active devices 106a and 106b, doped regions 108, an insulating layer 110 and contacts 112a and 112b. The capacitor 102 is disposed in the substrate 100. The capacitor 102 further comprises a lower electrode 114, a capacitor dielectric layer 116 and an upper electrode 118. The isolation structure 104 is disposed in the substrate 100. Furthermore, a portion of the isolation structure 104 is disposed in the capacitor 102. The active devices 106a and 106b are disposed on the substrate 100. The active device 106b disposed on the capacitor 102 serves as a passing gate and the active device 106a disposed beside the capacitor 102 serves as a switching gate. The doped regions 108 are disposed in the substrate 100 on the respective sides of the active device 106a so that the active device 106a is electrically connected to the capacitor 102. Furthermore, the doped regions 108 can also serve as a source/drain region. The insulating layer 110 is disposed on the substrate 100 between the active device 106b and the capacitor 102. The contacts 112a and 112b are disposed on the substrate 100 such that the contacts 112a and the doped region 108 are electrically connected and the contacts 112b is electrically connected to the capacitor 102 after penetrating through the insulating layer 110.

However, the aforementioned disposition of the DRAM capacitor limits the level of device integration. In other words, the level of integration can hardly increase even if the technique for producing finer lines is continuously improved because of the aforementioned spatial constraint for the memory. As a result, fabricating more devices within a limited space and increasing the spatial utilization of a wafer is an issue that every semiconductor manufacturer concerns.

SUMMARY OF THE INVENTION

Accordingly, at least one objective of the present invention is to provide a trench capacitor and fabricating method thereof for increasing the level of integration of devices and providing a larger processing window.

To achieve these and other advantages and in accordance with the purpose of the invention, as embodied and broadly described herein, the invention provides a method of fabricating trench capacitors. First, a substrate having at least one isolation structure is provided. Then, a first trench and a second trench are formed in the substrate beside the isolation structure. Next, a first lower electrode and a second lower electrode are formed in the substrate around the first trench and the second trench. A first capacitor dielectric layer and a second capacitor dielectric layer are formed on the respective surfaces of the first trench and the second trench. After that, a first upper electrode and a second upper electrode are formed to fill the first trench and the second trench. A portion of the isolation structure between the first trench and the second trench is removed to form an opening. A conductive layer is formed to fill the opening and connect electrically with the first upper electrode and the second upper electrode.

According to the method of fabricating trench capacitors in the preferred embodiment of the present invention, after forming the conductive layer in the opening, further includes forming contacts on the conductive layer.

According to the method of fabricating trench capacitors in the preferred embodiment of the present invention, after forming the conductive layer in the opening, further includes forming a first contact and a second contact on the first upper electrode and the second upper electrode respectively.

The present invention also provides an alternative method of fabricating a trench capacitor. First, a substrate having at least one isolation structure is provided. Then, a first trench and a second trench are formed in the substrate beside the isolation structure. Next, a portion of the isolation structure between the first trench and the second trench are removed to form an opening between the first trench and the second trench. After that, a first lower electrode and a second lower electrode are formed in the substrate around the first trench and the second trench. A first capacitor dielectric layer and a second capacitor dielectric layer are formed on the respective surfaces of the first trench and the second trench. After that, a first upper electrode and a second upper electrode are formed to fill the first trench and the second trench. Then, a conductive layer is formed to fill the opening and connect electrically with the first upper electrode and the second upper electrode.

According to the method of fabricating trench capacitors in the preferred embodiment of the present invention, after filling the first upper electrode, the second upper electrode and the conductive layer, further comprises forming contacts on the conductive layer.

According to the method of fabricating trench capacitors in the preferred embodiment of the present invention, after filling the first upper electrode, the second upper electrode and the conductive layer, further includes forming a first contact and a second contact on the first upper electrode and the second upper electrode respectively.

The present invention also provides a trench capacitor comprising a substrate, at least a group of capacitor units, an isolation structure and a conductive layer. The substrate further includes a first trench and a second trench. The group of capacitor units is disposed in the substrate. The group of capacitor units comprises a first capacitor disposed in the first trench and a second capacitor disposed in the second trench. The first capacitor and the second capacitor further comprise:

a first lower electrode and a second lower electrode disposed in the substrate around the first trench and the second trench respectively; a first upper electrode and a second upper electrode disposed in the first trench and the second trench respectively; and, a first capacitor dielectric layer and a second capacitor dielectric layer disposed between the surface of the first trench and the first upper electrode and between the surface of the second trench and the second upper electrode. The isolation structure is disposed in the substrate between the first capacitor and the second capacitor. The conductive layer is disposed in the substrate above the isolation structure and electrically connected to the first upper electrode and the second upper electrode.

According to the aforementioned trench capacitor in the preferred embodiment of the present invention, the trench capacitor further comprises a contact disposed on the conductive layer.

According to the aforementioned trench capacitor in the preferred embodiment of the present invention, the trench capacitor further comprises a first contact and a second contact disposed on the first upper electrode and the second upper electrode respectively.

In the present invention, two capacitors are combined to form a group of capacitor units. Since the space needed to accommodate each capacitor is reduced, the degree of integration of the devices will increase. Furthermore, through the electrical connection of the conductive layer, only one contact needs to be disposed on each group of capacitor units. Therefore, the process window for forming an active device in a subsequent operation is increased. In addition, if a contact is formed on each capacitor, then an adjacent contact can be used to replace the original contact when one of the contacts has connectivity problem. This is because two adjacent capacitors are also electrically connected to each other through the conductive layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
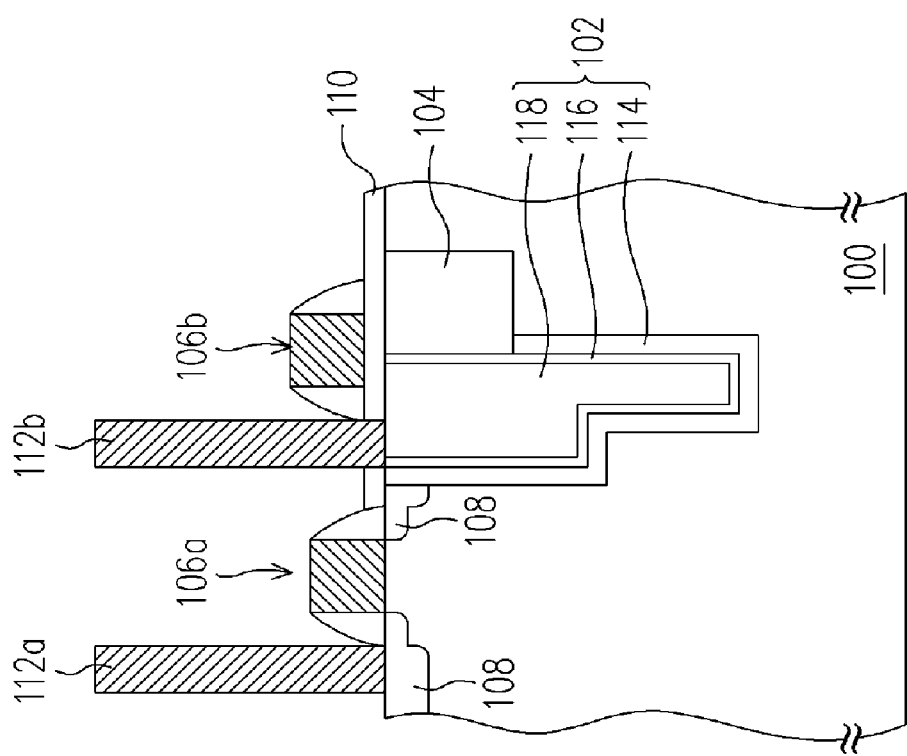
FIG. 1 is a schematic cross-sectional view showing the structure of a conventional DRAM.

Reference will now be made in detail to the present preferred embodiments of the invention, examples of which are illustrated in the accompanying drawings. Wherever possible, the same reference numbers are used in the drawings and the description to refer to the same or like parts.

Figure 2:
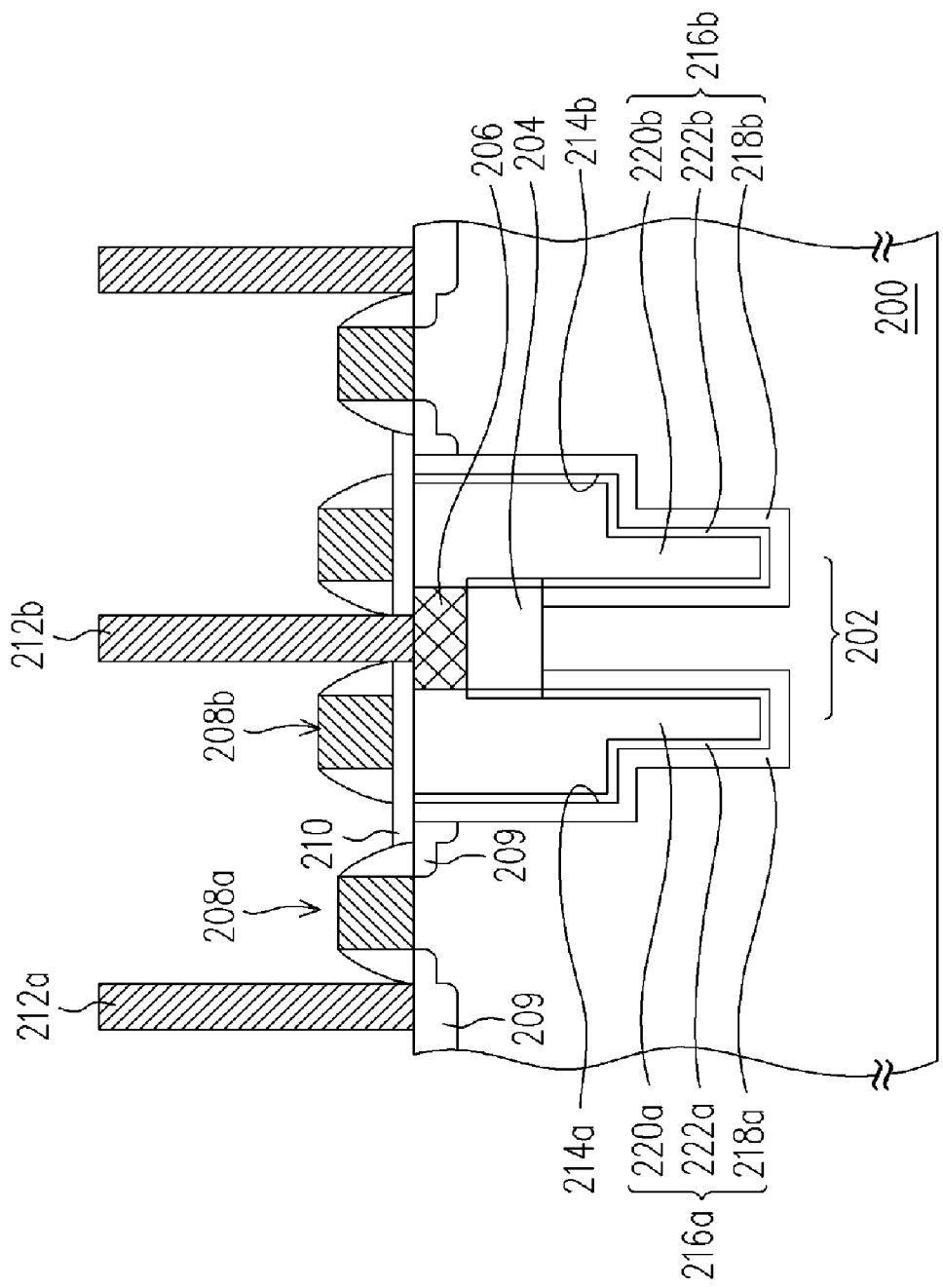
FIG. 2 is a schematic cross-sectional view of a DRAM according to one preferred embodiment of the present invention.

FIG. 2 is a schematic cross-sectional view of a DRAM according to one preferred embodiment of the present invention.

As shown in FIG. 2, the DRAM comprises a substrate 200, at least a group of capacitor units 202, an isolation structure 204, a conductive layer 206, active devices 208a and 208b, doped regions 209, an insulating layer 210 and contacts 212a and 212b.

The substrate 200 is a silicon substrate having a first trench 214 and a second trench 214b, for example. The group of capacitor units 202 is disposed in the substrate 200. The group of capacitor units 202 comprises a first capacitor 216a disposed in the first trench 214a and a second capacitor 216a disposed in the second trench 214b. The first capacitor 216a comprises a lower electrode 218a, an upper electrode 220a and a capacitor dielectric layer 222a ; and the second capacitor 216b comprises a lower electrode 218b, an upper electrode 220b and a capacitor dielectric layer 222b. The lower electrode 218a and the lower electrode 218b are disposed in the substrate 200 around the trenches 214a and 214b respectively. The lower electrode 218a and the lower electrode 218b are doped regions formed, for example, by implanting n-type dopants (for example, arsenic ions) or p-type dopants (for example, boron ions) according to the respective states of the active devices 208a and 208b. The upper electrode 220a and the upper electrode 220b are disposed in the first trench 214a and the second trench 214b respectively. The upper electrodes 220a and 220b are fabricated using a material including polysilicon, doped polysilicon or other suitable conductive material, for example. The capacitor dielectric layer 222a is disposed between the surface of the trench 214a and the upper electrode 220a ; and the capacitor dielectric layer 222b is disposed between the surface of the trench 214b and the upper electrode 220b. The capacitor dielectric layer 222a and the capacitor dielectric layer 222b are silicon oxide layers or oxide/nitride/oxide stack layers, for example.

The isolation structure 204 is disposed in the substrate 200 between the capacitor 216a and the capacitor 216b. The isolation structure 204 is a shallow trench isolation (STI) structure fabricated using silicon oxide, for example. The conductive layer 206 is disposed in the substrate 200 above the isolation structure 204 and is electrically connected to the upper electrode 214a and the upper electrode 214b.

The active devices 208a and 208b are disposed on the substrate 200. Furthermore, the active device 208b disposed on the capacitor 216a and the capacitor 216b serves as a passing gate. The active device 208a disposed beside the capacitor 216a and the capacitor 216b serves as a switching gate. In addition, the doped region 209 is disposed in the substrate 200 on each side of the active device 208a so that the active device 208a and the trench capacitors 216a and 216b are electrically connected. The doped regions 209 serve as source/drain regions.

The insulating layer 210 is disposed on the substrate 200 and located between the active device 208b and the trench capacitor 216a or the trench capacitor 216b. The insulating layer 210 is fabricated using an insulating material such as silicon oxide or silicon nitride.

The contacts 212a and 212b are disposed on the substrate 200. The contact 212a is electrically connected to the doped region 209 and the contact 212b is electrically connected to the trench capacitor 216a and the trench capacitor 216b through the conductive layer 212b after penetrating through the insulating layer 210. It should be noted that the capacitors 216a and 216b are electrically connected through the disposition of the conductive layer 206. Thus, only one contact 212b is needed to dispose on one group of capacitor units 202. Consequently, the active device 208b can have a larger disposition space and the fabrication can have a larger process window.

Figure 3:
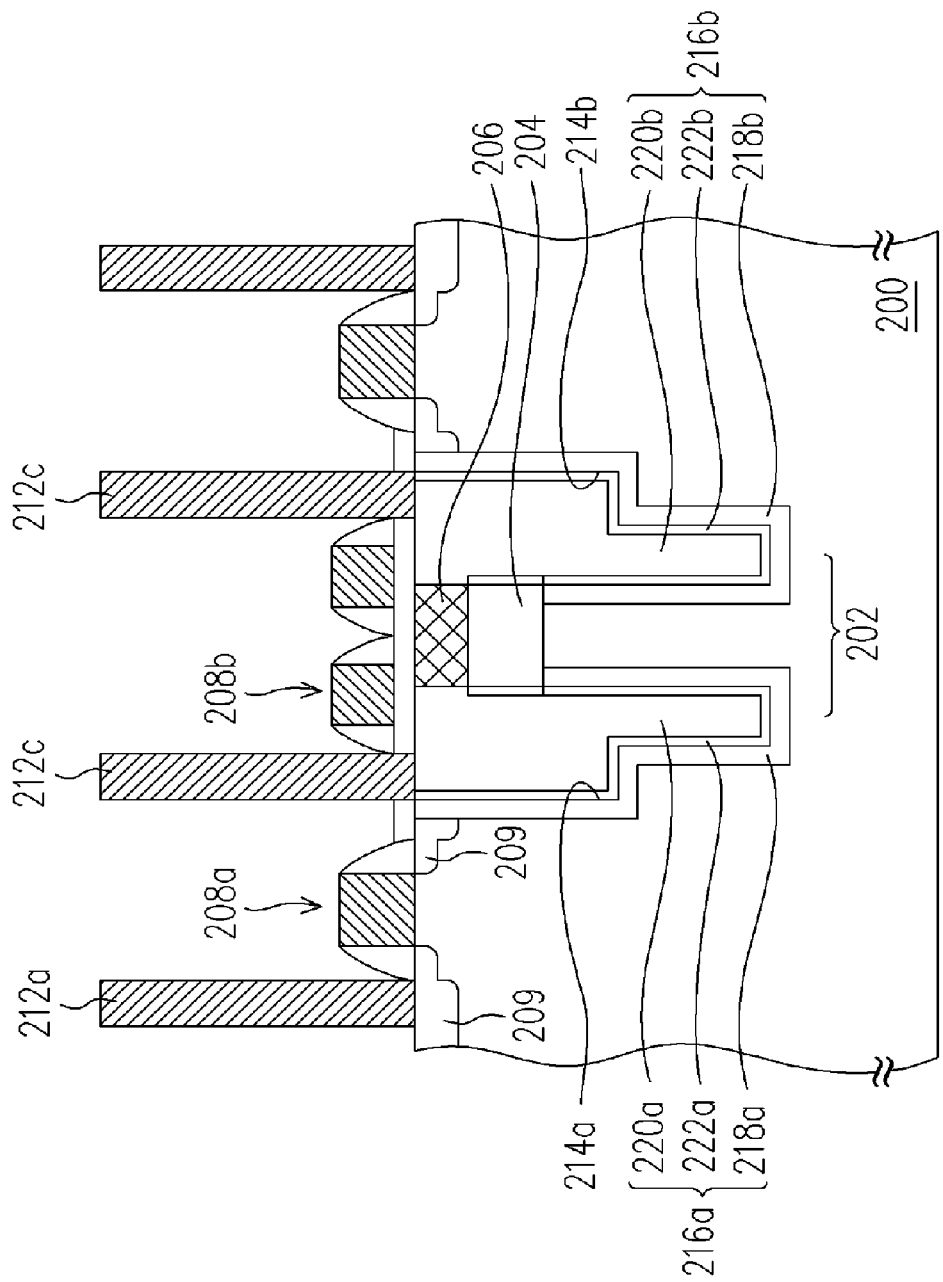
FIG. 3 is a schematic cross-sectional view of a DRAM according to another preferred embodiment of the present invention.

In another preferred embodiment, each of the capacitors 216a and 216b can have a contact 212c (as shown in FIG. 3). Hence, when one of the contacts has electrical connection problem, another contact can replace the original contact because two adjacent capacitors 216a and 216b are electrically connected through the conductive layer 206.

In the following, two embodiments are used to describe the method of fabricating the aforementioned DRAM. However, they should by no means limit the scope of the present invention as such.

First Embodiment

Figure 4A:
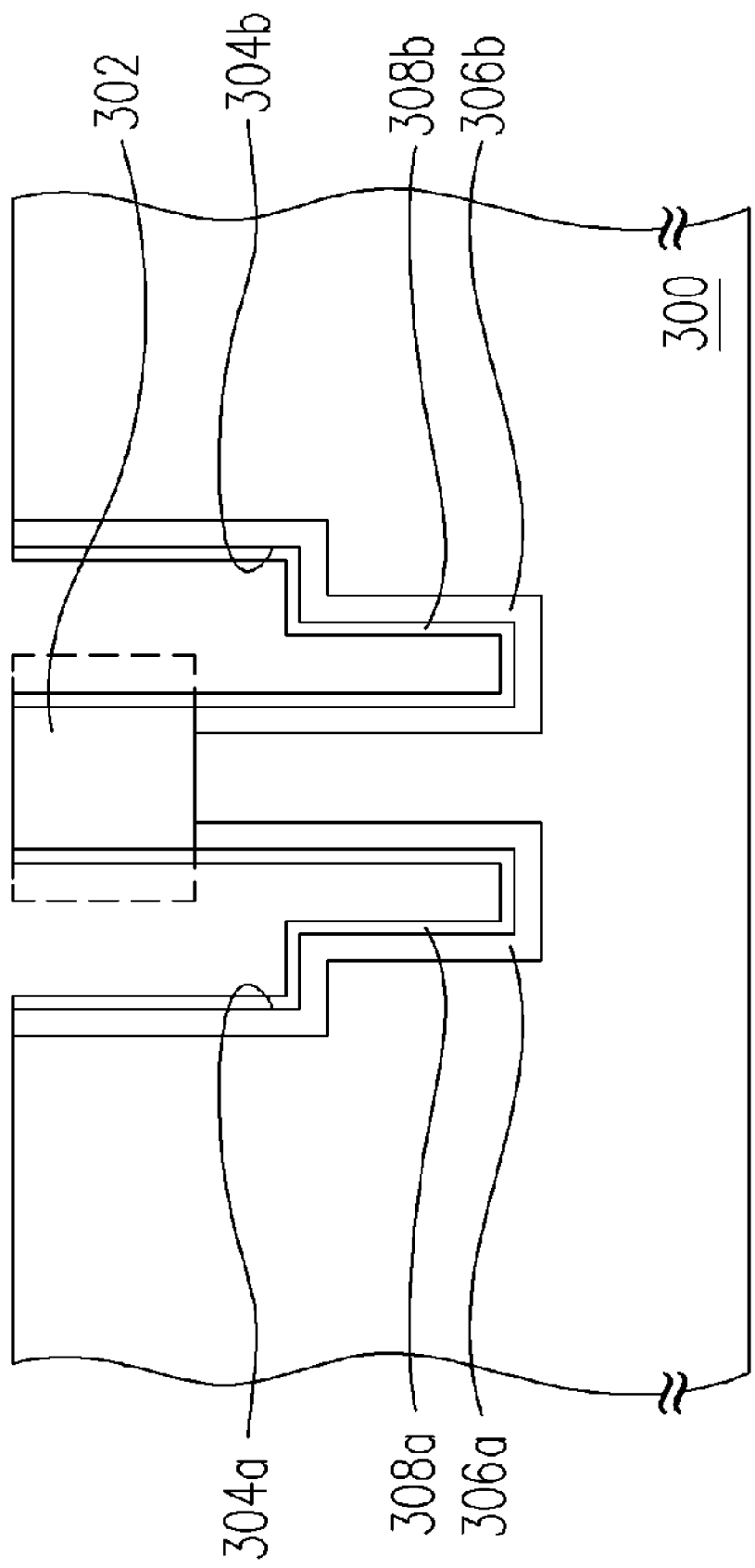
FIGS. 4A through 4E are schematic cross-sectional views showing the steps for fabricating a DRAM according to one preferred embodiment of the present invention.

FIGS. 4A through 4E are schematic cross-sectional views showing the steps for fabricating a DRAM according to one preferred embodiment of the present invention. First, as shown in FIG. 4A, a substrate 300 is provided. The substrate has at least an isolation structure 302 formed thereon. The substrate 300 is a silicon substrate and the isolation structure 302 is a shallow trench isolation (STI) structure fabricated using silicon oxide, for example.

Then, trenches 304a and 304b are formed in the substrate 300 beside the isolation structure 302. The trenches 304a and 304b are formed, for example, by performing a patterning process using a mask layer. In one embodiment, the trenches 304a and 304b penetrate through the isolation structure 302. The dash line portion represents that portion of the isolation structure 302 is removed in the process of forming the trenches 304a and 304b.

After that, a first lower electrode 306a and a second lower electrode 306b are formed in the substrate 300 around the trenches 304a and 304b respectively. The method of fabricating the lower electrodes 306a and 306b includes forming doped insulating layers 308a and 308b on the surface of the respective trenches 304a and 304b and then performing a thermal treatment. The doped insulating layers 308a and 308b are fabricated using an arsenic doped silicon oxide layer or a boron doped silicon oxide layer according to the desired state of the subsequently formed active device.

Figure 4B:
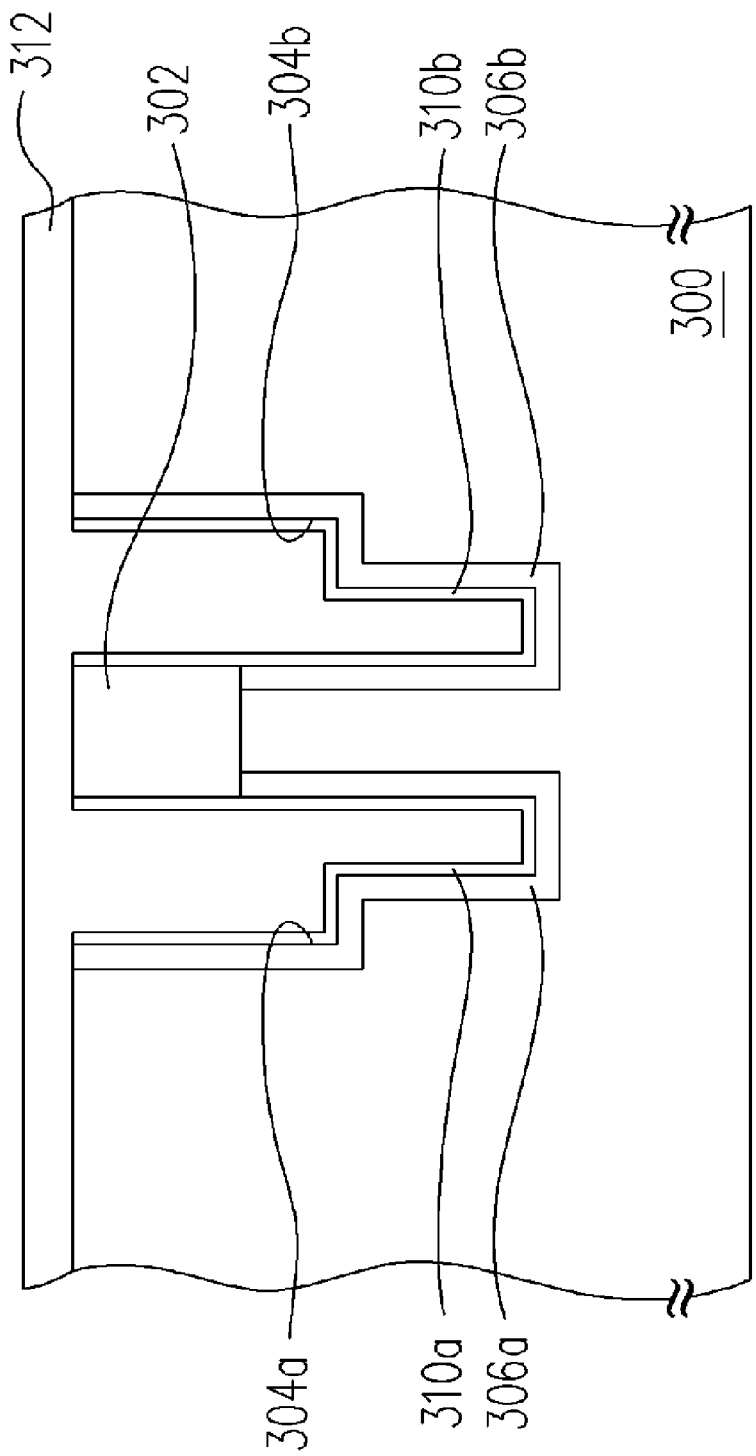

As shown in FIG. 4B, after removing the doped insulating layers 308a and 308b, capacitor dielectric layers 310a and 310b are formed on the surface of the respective trenches 304a and 304b. The capacitor dielectric layers 310a and 310b can be a silicon oxide layer or an oxide/nitride/oxide stack layer, for example.

Next, conductive material is deposited into the trenches 304a and 304b to form a conductive material layer 312. The conductive material layer 312 is fabricated using a conductive material including polysilicon and doped polysilicon, for example. The method of filling the trenches 304a and 304b with conductive material to form the conductive material layer 312 includes, for example, performing a chemical vapor deposition process.

Figure 4C:
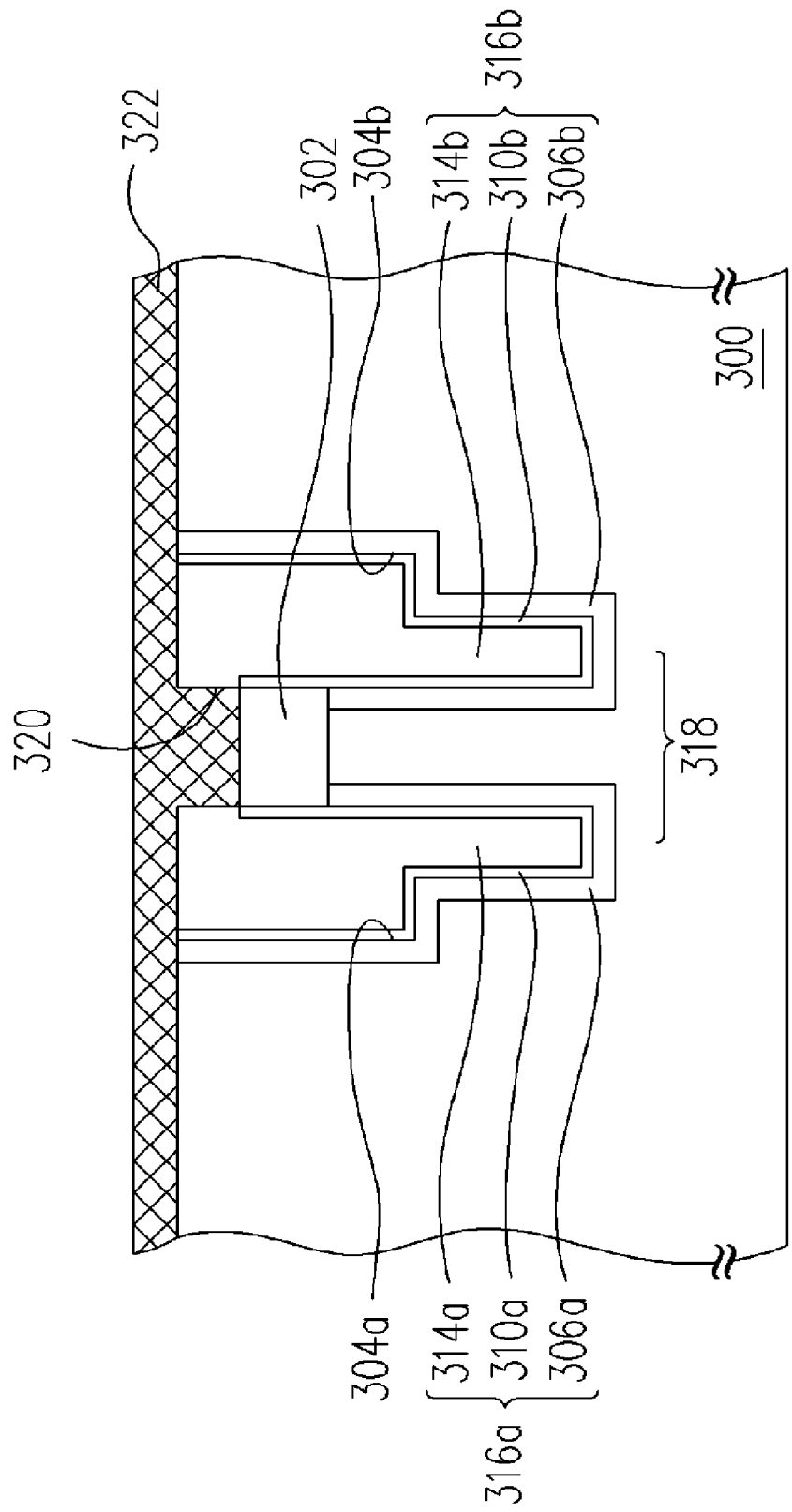

As shown in FIG. 4C, the conductive material layer 312 outside the trenches 304a and 304b are removed to form the upper electrodes 314a and 314b. The method of removing the conductive material layer 312 outside the trenches 304a and 304b includes, for example, performing a chemical-mechanical polishing operation. It should be noted that the upper electrode 314a together with the previously formed capacitor dielectric layer 310a and lower electrode 306a form a capacitor 316a. Similarly, the upper electrode 314b together with the capacitor dielectric layer 310b and the lower electrode 306b form another capacitor 316b. Meanwhile, the capacitor 316a and the capacitor 316b together constitute one group of capacitor units 318.

Then, a portion of the isolation structure 302 between the trench 304a and the trench 304b is removed to form an opening 320. The method of removing a portion of the isolation structure 302 between the trenches 304a and 304b includes performing an etching operation such as a dry etching operation or a wet etching operation.

After that, a conductive material is deposited into the opening 320 to form a conductive material layer 322. The conductive material layer is fabricated using a conductive material including polysilicon or doped polysilicon, for example. The method of forming the conductive material layer 322 includes performing a chemical vapor deposition process, for example.

Figure 4D:
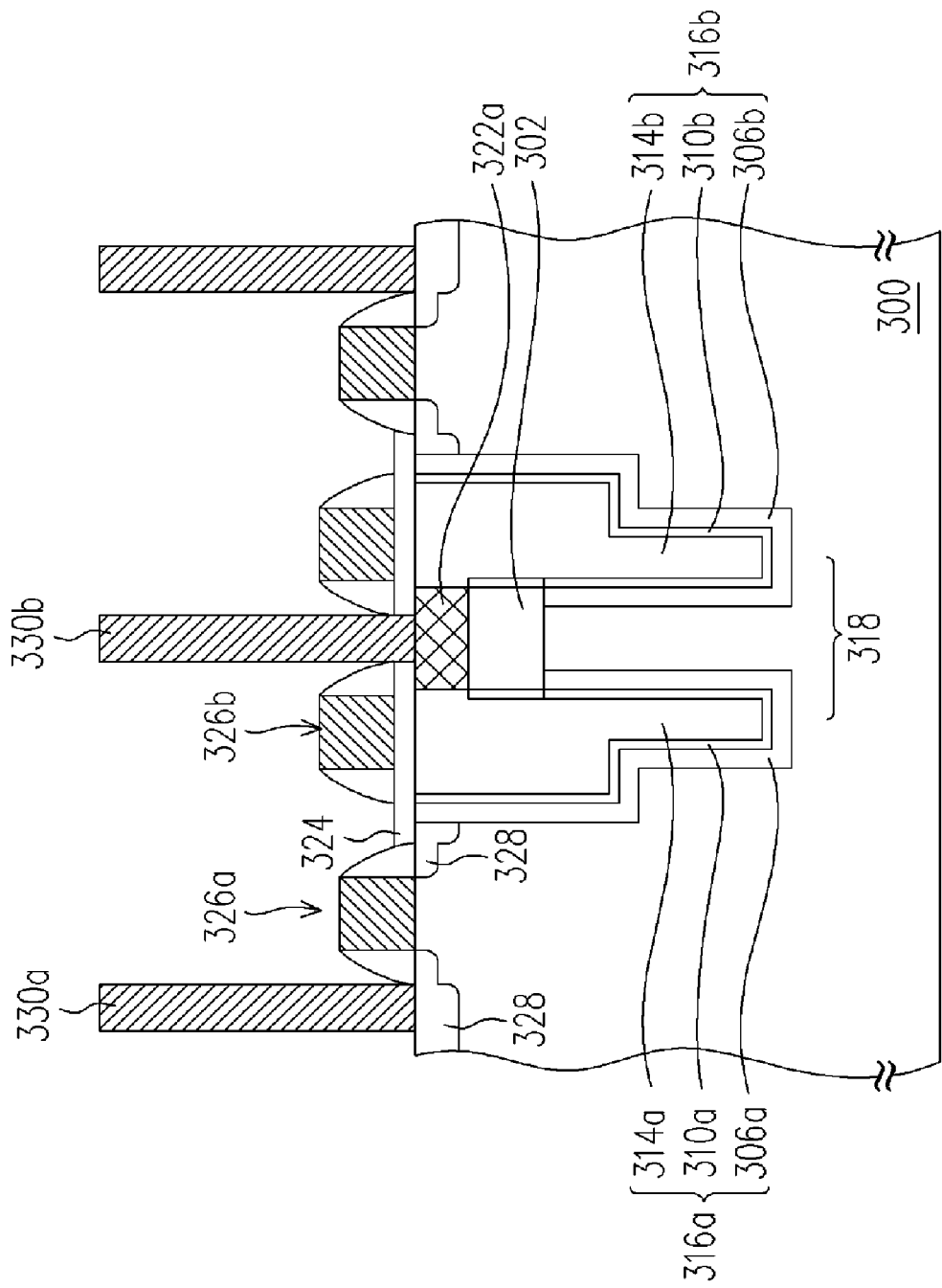

As shown in FIG. 4D, the conductive material layer 322 outside the opening 320 is removed to form a conductive layer 322a. The conductive layer 322a connects electrically with the upper electrodes 314a and 314b. The method of removing the conductive material layer 322 outside the opening 320 includes performing a chemical-mechanical polishing operation, for example.

Then, an insulating layer 324 is formed over the surface of the capacitor units 318. The insulating layer 324 is fabricated using an insulating material such as silicon oxide, for example. Active devices 326a and 326b are formed on the substrate 300 and the insulating layer 324 respectively; and then doped regions 328 are formed in the substrate 300. The active devices 326b formed over the capacitors 316a and 316b serve as passing gates and the active devices 326a formed beside the capacitors 316a and 316b serve as switching gates. Furthermore, the doped regions 328 serve as source/drain regions such that the active devices 326a and the capacitors 316a and 316b are electrically connected. The active devices 326a and 326b are fabricated using a conventional transistor manufacturing process. Since the process and related details of fabricating transistors should be familiar to those of ordinary skills in this field, thus a detailed description of the active devices 326a and 326b is omitted.

After that, a contact 330a is formed on the doped region 328 and another contact 330b is formed on the conductive layer 322a. The contact 330b penetrates through the insulating layer 324. It should be noted that only one contact 330a is needed to dispose on each group of capacitor units 318 because the capacitor 316a and the capacitor 316b can be electrically connected through the conductive layer 322a in the present invention. Thus, the process window for fabricating the active devices 326b is increased.

Figure 4E:
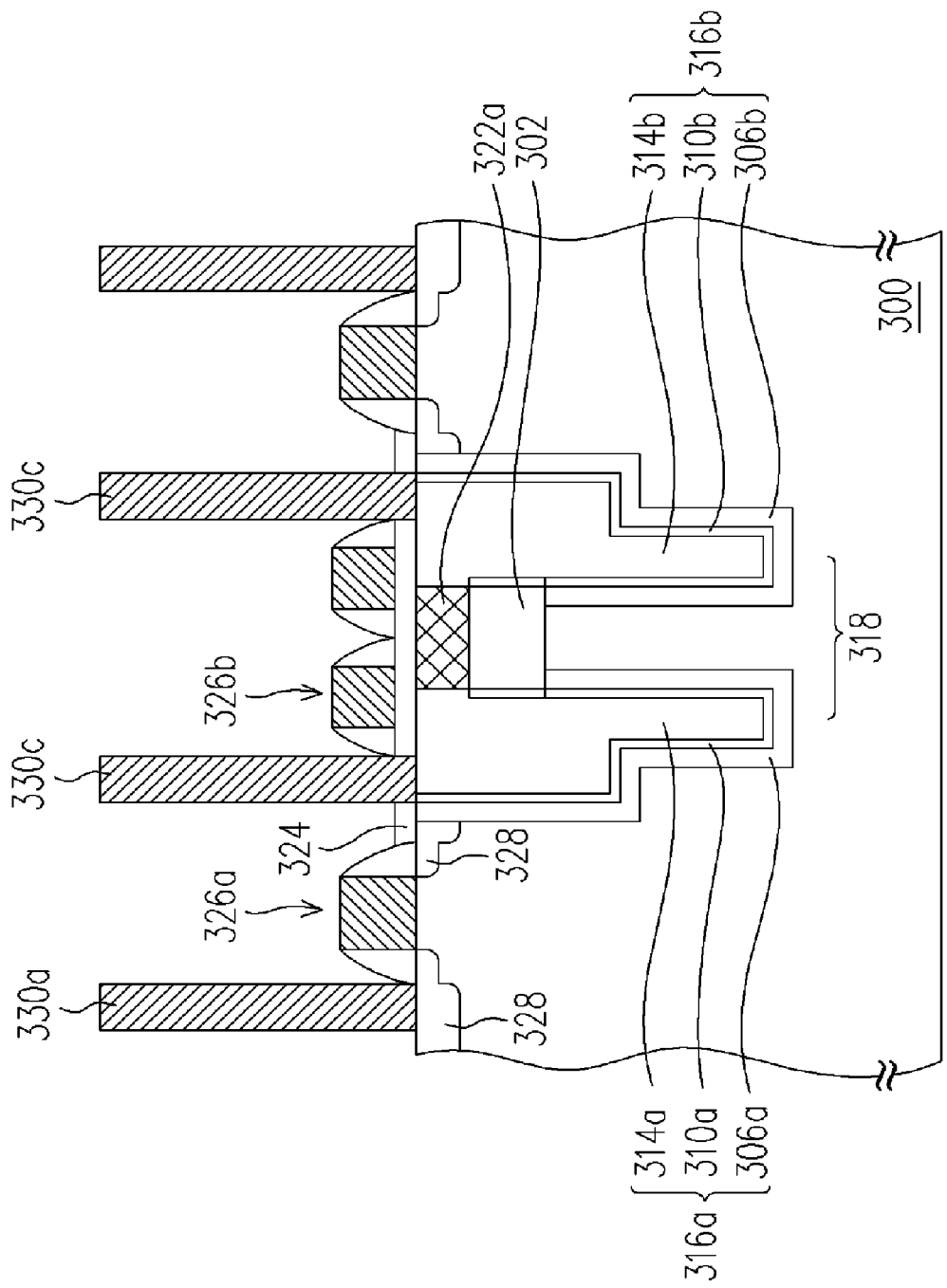

However, in another embodiment, each of the capacitors 316a and 316b may have a contact 330c formed thereon (as shown in FIG. 4E). When one of the contacts encounters an electrical connection problem, another contact can replace the original contact because two adjacent capacitors 316a and 316b are electrically connected through the conductive layer 322a.

Second Embodiment

Figure 5A:
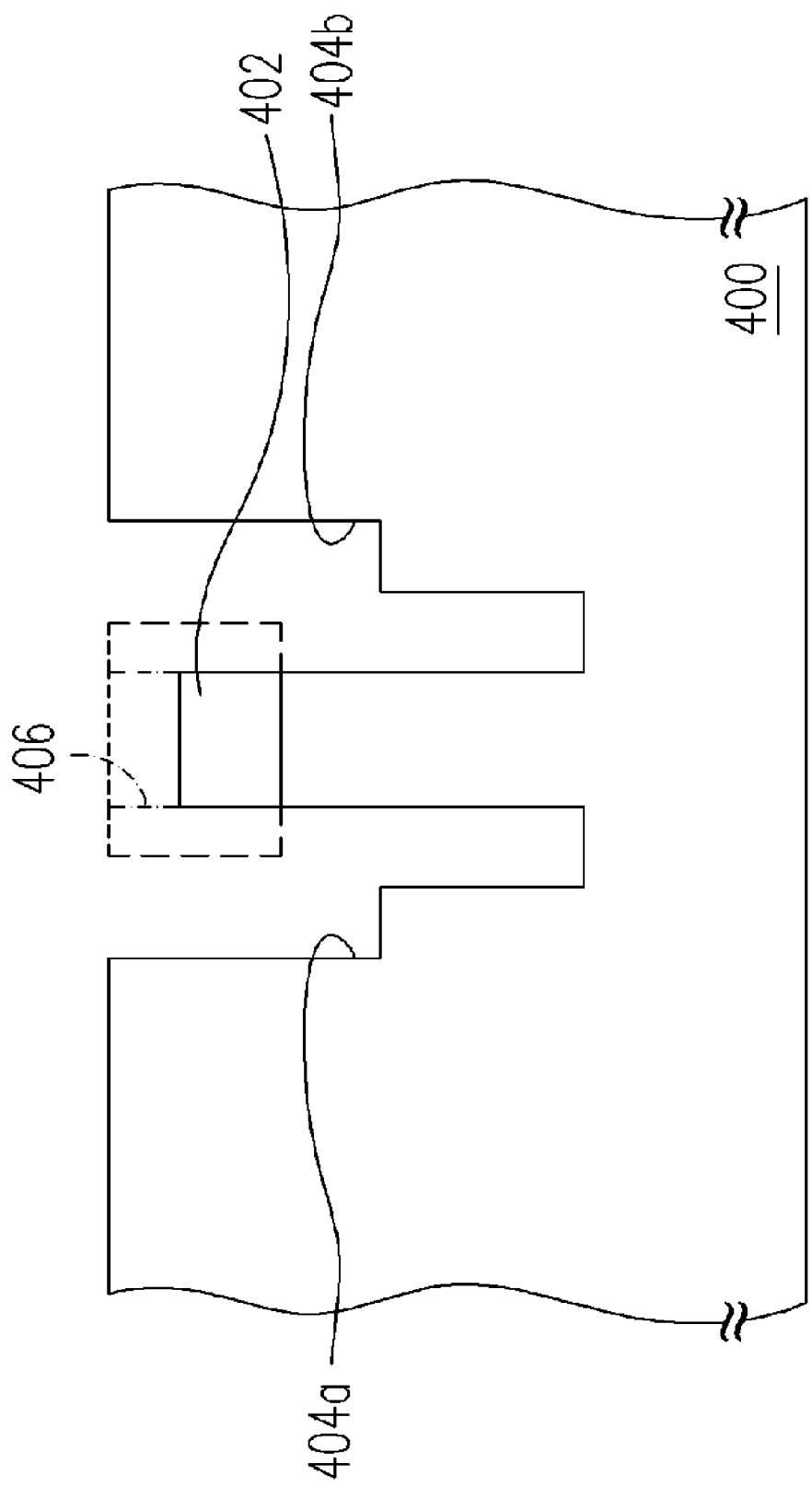
FIGS. 5A through 5E are schematic cross-sectional views showing the steps for fabricating a DRAM according to another preferred embodiment of the present invention.

FIGS. 5A through 5E are schematic cross-sectional views showing the steps for fabricating a DRAM according to another preferred embodiment of the present invention. First, as shown in FIG. 5A, a substrate 400 is provided. The substrate has at least an isolation structure 402 formed thereon. The substrate 400 is a silicon substrate and the isolation structure 402 is a shallow trench isolation (STI) structure fabricated using silicon oxide, for example.

Trenches 404a and 404b are formed in the substrate 400 beside the isolation structure 402 and then a portion of the isolation structure 402 between the trenches 404a and 404b is removed to form an opening 406. The trenches 404a and 404b and the opening 406 are formed, for example, by performing a patterning process using a mask layer. In one embodiment, the trenches 404a and 404b penetrate through the isolation structure 402. The dash line portion represents that portion of the isolation structure 402 is removed in the process of forming the trenches 404a and 404b.

Figure 5B:
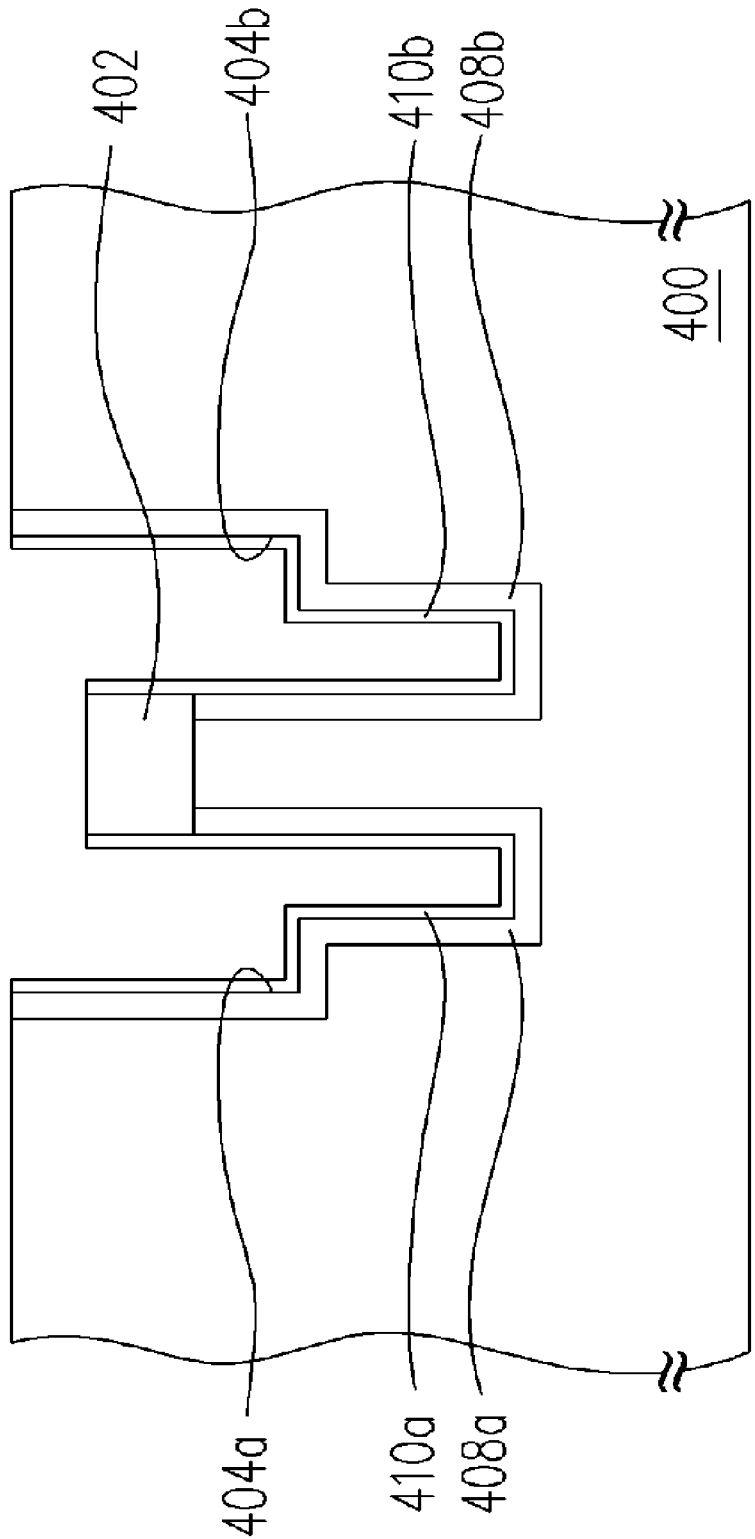

As shown in FIG. 5B, a first lower electrode 408a and a second lower electrode 408b are formed in the substrate 400 around the respective trenches 404a and 404b. The method of fabricating the lower electrodes 408a and 408b includes forming doped insulating layers 410a and 410b on the respective surfaces of the trenches 404a and 404b and then performing a thermal treatment. The doped insulating layers 410a and 410b are arsenic doped or boron doped silicon oxide layers according to the desired state of the subsequently formed active devices.

Figure 5C:
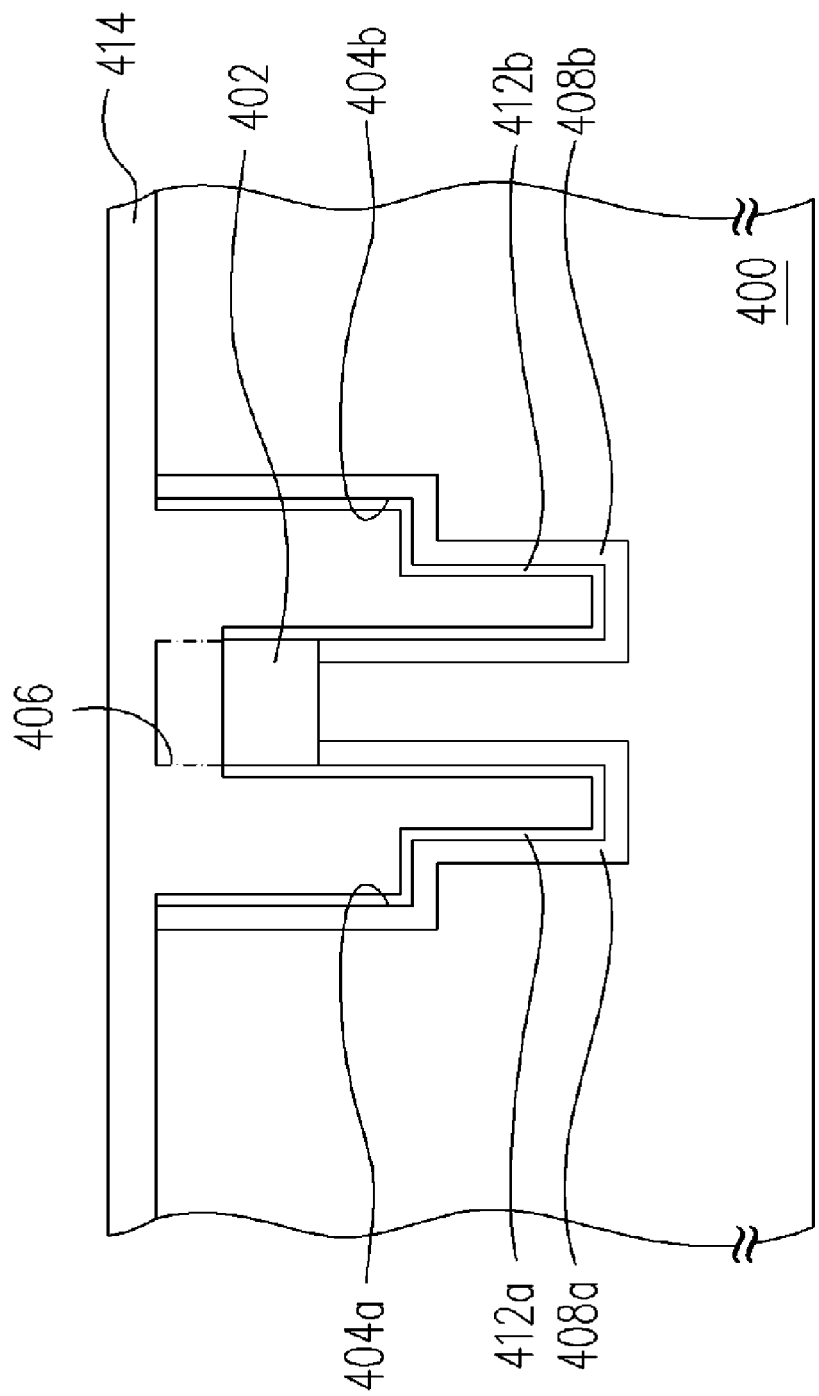

As shown in FIG. 5C, after removing the doped insulating layers 410a and 410b, capacitor dielectric layers 412a and 412b are formed on the respective surfaces of the trenches 404a and 404b. The capacitor dielectric layers 412a and 412b can be a silicon oxide layer or an oxide/nitride/oxide stack layer, for example.

Then, a conductive material is deposited into the trenches 404a, 404b and the opening 406 to form a conductive material layer 414. The conductive material layer 414 is fabricated using a conductive material such as polysilicon or doped polysilicon, for example. The method of depositing conductive material to form the conductive material layer 414 includes performing a chemical vapor deposition process, for example.

Figure 5D:
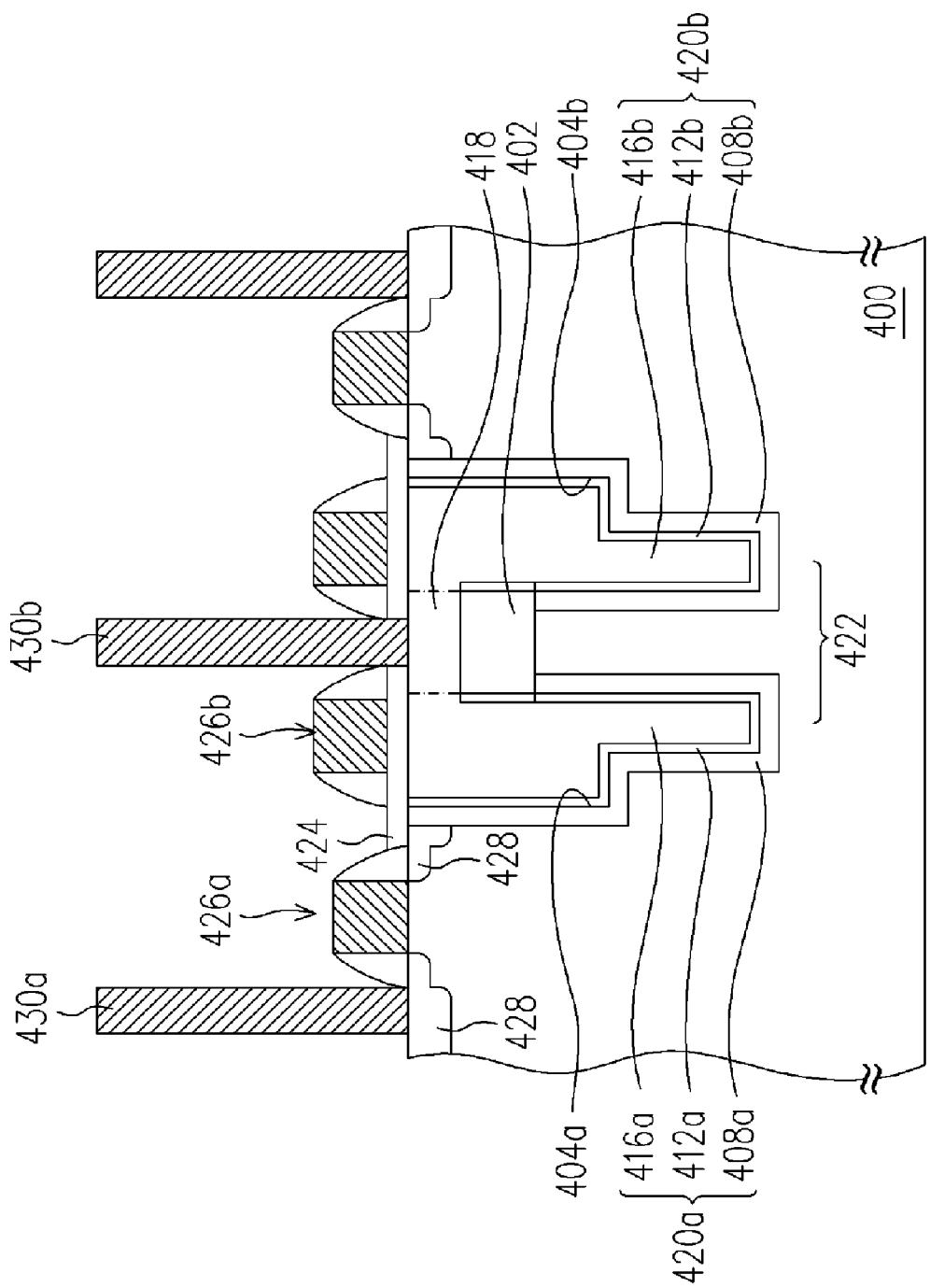

As shown in FIG. 5D, the conductive material layer 414 outside the trenches 404a, 404b and the opening 406 is removed to form upper electrodes 416a, 416b and a conductive layer 418. The method of removing the conductive material layer 414 outside the trenches 404a, 404b and the opening 406 includes performing a chemical-mechanical polishing operation. It should be noted that the upper electrode 416a together with the previously formed capacitor dielectric layer 412a and the lower electrode 408a form a capacitor 420a. Similarly, the upper electrode 416b, the capacitor dielectric layer 412b and the lower electrode 408b form another capacitor 420b. The capacitors 420a and 420b constitute a group of capacitor units 422. Furthermore, the capacitor 420a and the capacitor 420b are electrically connected through the conductive layer 418.

Next, an insulating layer 424 is formed over the surface of the capacitor units 422. The insulating layer 424 is fabricated using an insulating material such as silicon oxide, for example. Active devices 426a and 426b are formed on the substrate 400 and the insulating layer 424 respectively; and then doped regions 428 are formed in the substrate 400. The active devices 426b formed over the capacitors 420a and 420b serve as passing gates and the active devices 426a formed beside the capacitors 420a and 420b serve as switching gates. Furthermore, the doped regions 428 serve as source/drain regions such that the active devices 426a and the capacitors 420a and 420b are electrically connected. The active devices 420a and 420b are fabricated using a conventional transistor manufacturing process. Since the process and related details of fabricating transistors should be familiar to those of ordinary skills in this field, thus a detailed description of the active devices 426a and 426b is omitted.

After that, a contact 430a is formed on the doped region 428 and another contact 430b is formed on the conductive layer 418. The contact 430b penetrates through the insulating layer 424. It should be noted that only one contact 430b is needed to dispose on each group of capacitor units 422 because the capacitor 420a and the capacitor 420b can be electrically connected through the conductive layer 418 in the present invention. Thus, the process window for fabricating the active devices 426b is increased.

Figure 5E:
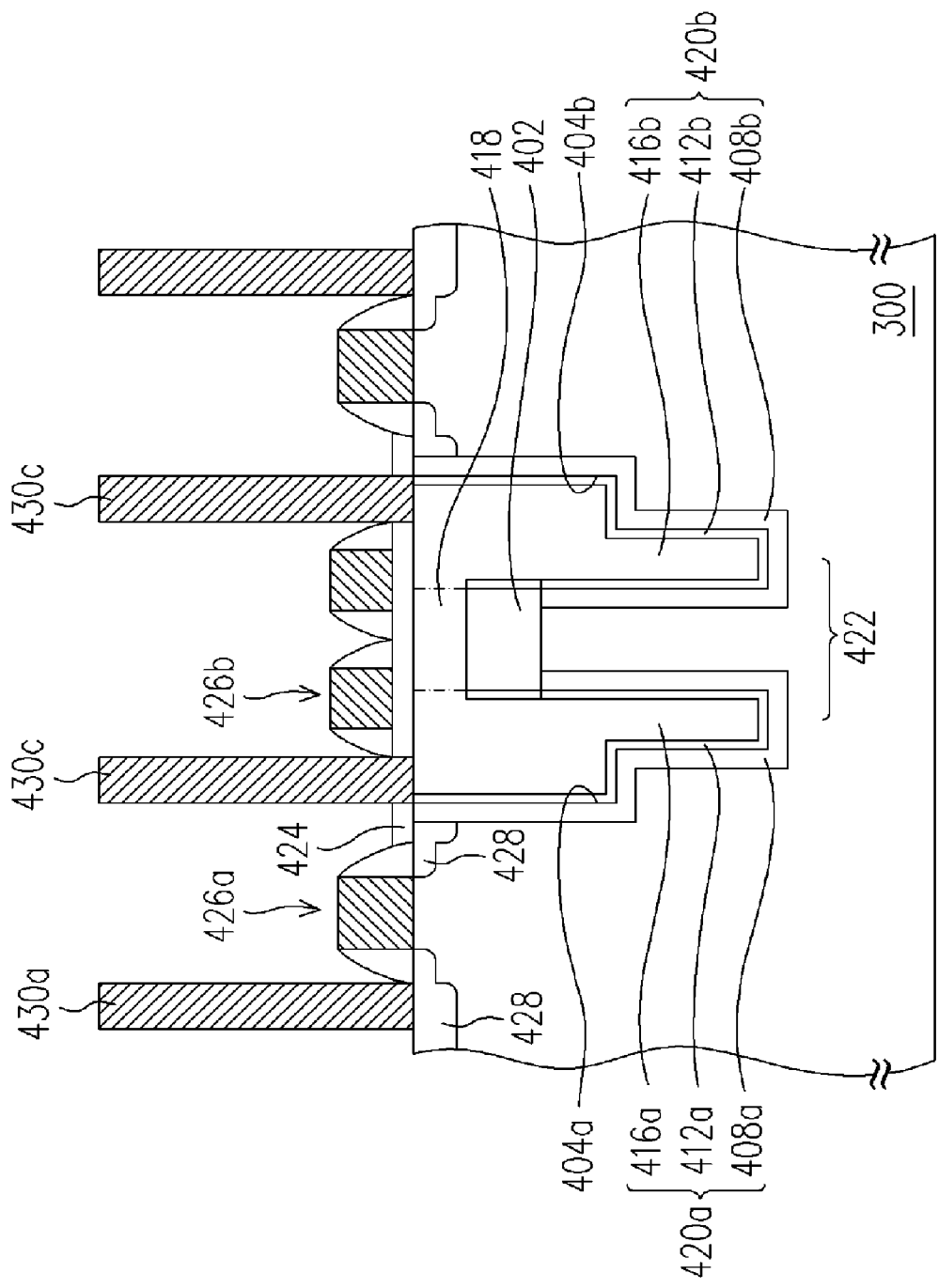

However, in another embodiment, each of the capacitors 420a and 420b may have a contact 430c formed thereon (as shown in FIG. 5E). When one of the contacts encounters an electrical connection problem, another contact can replace the original contact because two adjacent capacitors 420a and 420b are electrically connected through the conductive layer 418.

In summary, the advantages of the present invention at least include:

1. Two capacitors are paired together to form a group of capacitor units. Since the space to accommodate a single capacitor is reduced, the level of integration of the devices can be increased.

2. Through the conductive layer, only a single contact is required for each group of capacitor units. Therefore, the process window of the subsequently formed active devices is increased.

3. If each capacitor is provided with a contact, another contact can be used to replace the original contact having electrical connection problem because two adjacent capacitors are electrically connected through the conductive layer.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating trench capacitors, comprising the steps of:
   providing a substrate having at least an isolation structure formed thereon;
   forming a first trench and a second trench in the substrate beside the isolation structure and removing a portion of the isolation structure between the first trench and the second trench to form an opening;
   forming a first lower electrode and a second lower electrode in the substrate around the first trench and the second trench respectively;
   forming a first capacitor dielectric layer and a second capacitor dielectric layer on the respective surfaces of the first trench and the second trench; and
   filling the first trench, the second trench and the opening with a conductive material to form a first upper electrode, a second upper electrode and a conductive layer, wherein the first upper electrode and the second upper electrode are electrically connected through the conductive layer.

2. The method of claim 1, wherein after forming the first upper electrode, the second upper electrode and the conductive layer. tbrther includes forming a contact on the conductive layer.

3. The method of claim 1, wherein after forming the first upper electrode, the second upper electrode and the conductive layer, further includes forming a first contact and a second contact on the first upper electrode and the second upper electrode respectively.

4. The method of claim 1, wherein the step of removing a portion of the isolation structure between the first trench and the second wench includes performing an etching operation.

5. The method of claim 1, wherein the first trench and second trench penetrate through the isolation structure.

6. The method of claim 1, wherein the steps for fanning the first lower electrode and the second lower electrode include:

forming a doped insulating layer on the respective surfaces of the first trench and the second trench; and performing a thermal treatment.

7. The method of claim 6, wherein the material constituting the doped insulating layer comprises an arsenic-doped silicon oxide layer or a boron-doped silicon oxide layer.

8. The method of claim 1, wherein the first capacitor dielectric layer and the second capacitor dielectric layer comprise a silicon oxide layer or an oxide/nitride/oxide stack layer.

* * * * *